(12) United States Patent
Lee et al.

(10) Patent No.: US 7,736,397 B2
(45) Date of Patent: Jun. 15, 2010

(54) METHOD FOR MANUFACTURING CAPACITOR EMBEDDED IN PCB

(75) Inventors: Seung Eun Lee, Seongnam (KR); Yul Kyo Chung, Yongin (KR); Hyung Dong Kang, Yongin (KR); Hyun Ju Jin, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 234 days.

(21) Appl. No.: 11/730,979

(22) Filed: Apr. 5, 2007

(65) Prior Publication Data

US 2007/0234539 A1    Oct. 11, 2007

(30) Foreign Application Priority Data

Apr. 5, 2006    (KR)    ............... 10-2006-0031099

(51) Int. Cl.
*H01L 21/8242* (2006.01)
*H01G 9/00* (2006.01)
(52) U.S. Cl. .............. 29/25.03; 29/25.41; 29/25.42; 361/313; 174/262; 438/361
(58) Field of Classification Search ............... 29/829, 29/830, 831, 846, 594, 592.1, 25.35–25.42, 29/25.01–25.04; 174/255, 262–264; 361/311–313, 361/322, 321.1; 438/625–627, 645, 687, 438/361, 393; 257/762, 752
See application file for complete search history.

(56) References Cited

U.S. PATENT DOCUMENTS

| 5,785,789 | A | * | 7/1998 | Gagnon et al. | ............... | 156/235 |
| 6,034,332 | A | * | 3/2000 | Moresco et al. | ............... | 174/255 |
| 6,056,864 | A | * | 5/2000 | Cheung | ............... | 205/222 |
| 6,600,229 | B2 | * | 7/2003 | Mukherjee et al. | ............... | 257/762 |
| 6,764,954 | B2 | * | 7/2004 | Diewald et al. | ............... | 438/692 |
| 6,819,540 | B2 | * | 11/2004 | Allen et al. | ............... | 361/302 |
| 6,839,219 | B2 | * | 1/2005 | Mashiko et al. | ............... | 361/311 |
| 6,841,080 | B2 | * | 1/2005 | Kingon et al. | ............... | 216/6 |
| 7,378,326 | B2 | * | 5/2008 | Ahn et al. | ............... | 438/361 |

FOREIGN PATENT DOCUMENTS

| JP | 61-045262 | 3/1986 |
| JP | 62-241671 | 10/1987 |
| JP | 11-214853 | 8/1999 |
| JP | 2000-340767 | 12/2000 |

(Continued)

OTHER PUBLICATIONS

Japanese Office Action issued in Japanese Patent Application No. 2007-096291, mailed Jun. 9, 2009.

(Continued)

*Primary Examiner*—Minh Trinh
(74) *Attorney, Agent, or Firm*—McDermott Will & Emery LLP

(57) ABSTRACT

A method for manufacturing a capacitor embedded in a PCB includes: preparing a copper clad lamination (CCL) substrate having a reinforcement member and copper foils formed on both surfaces of the reinforcement member; planarizing surfaces of the copper foils of the CCL substrate; forming a dielectric layer on the planarized surface of the copper foils; and forming a top electrode on the dielectric layer.

17 Claims, 3 Drawing Sheets

FOREIGN PATENT DOCUMENTS

| | | |
|---|---|---|
| JP | 2001-110675 | 4/2001 |
| JP | 2002-337025 | 11/2002 |
| JP | 2003-59870 | 2/2003 |
| JP | 2004-363191 | 12/2004 |
| JP | 2005-226139 | 8/2005 |
| KR | 2001-0008257 | 2/2001 |
| KR | 2003-0043234 | 6/2003 |
| KR | 1020040047264 A | 6/2004 |
| KR | 1020040057151 A | 7/2004 |

OTHER PUBLICATIONS

Japanese Office Action issued in Japanese Patent Application No. 2007-096291, dated Jan. 12, 2010.

* cited by examiner

[FIG. 1]
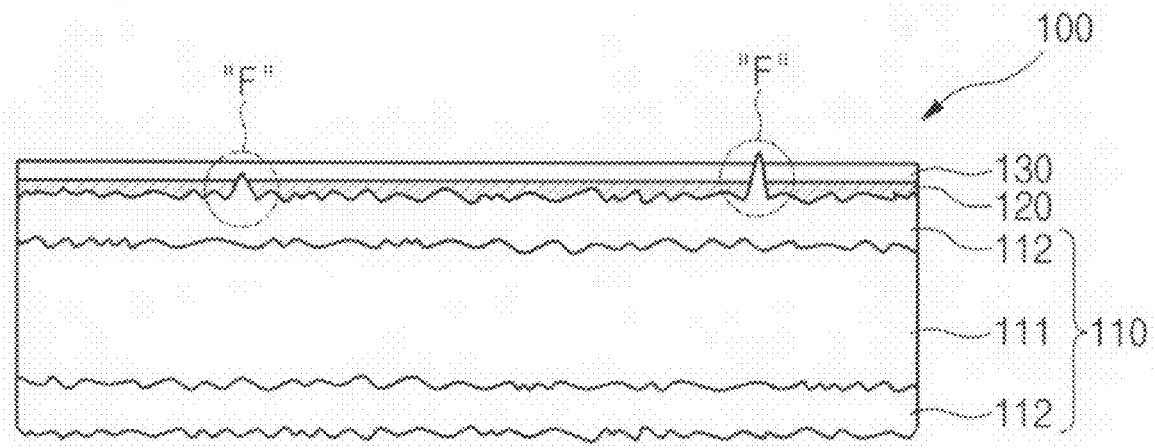
[FIG. 2]
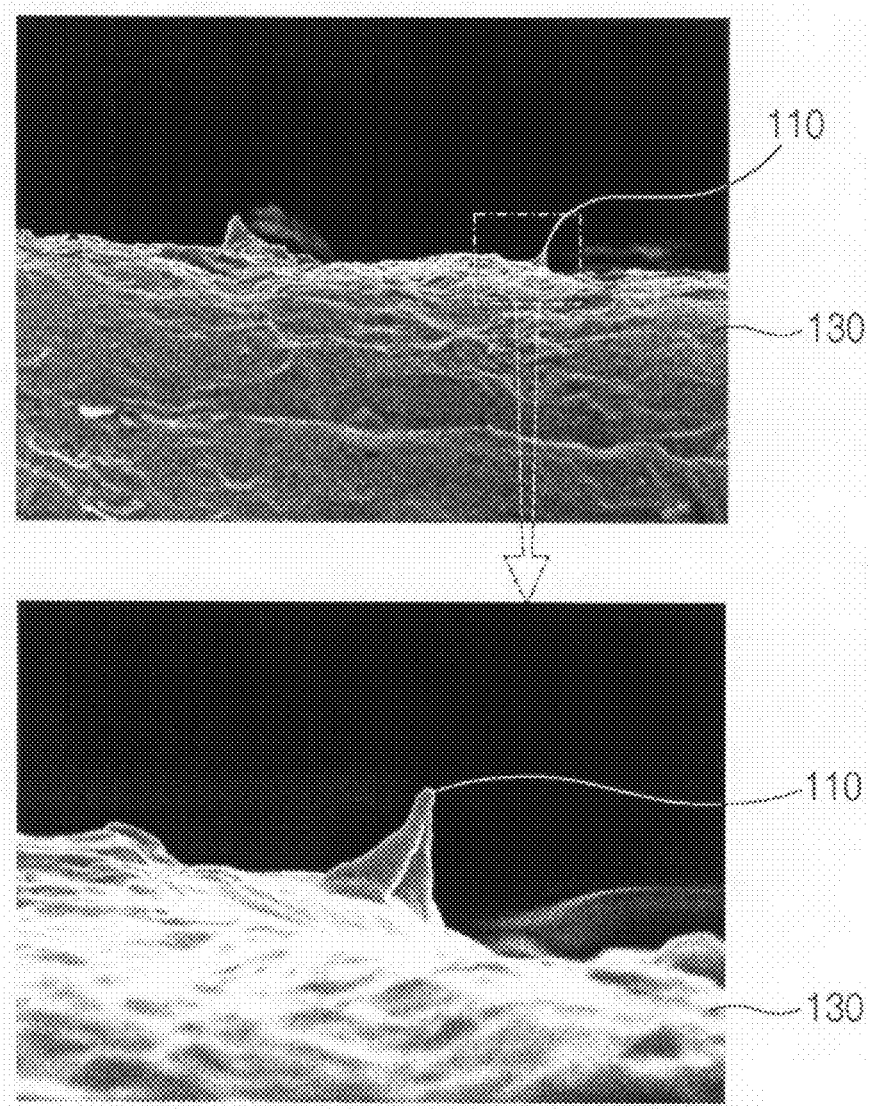

[FIG. 3A]
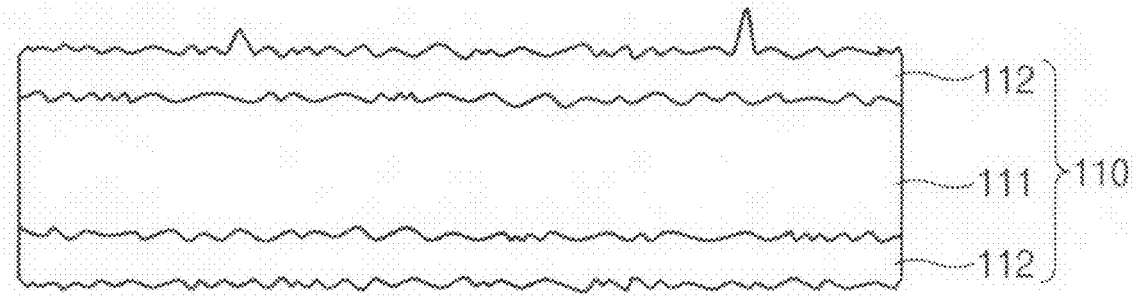
[FIG. 3B]
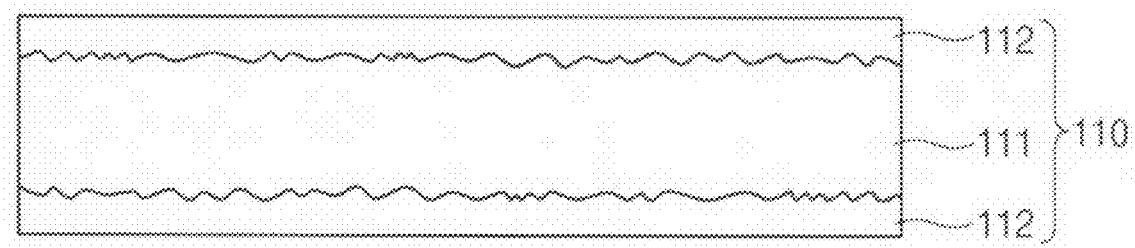
[FIG. 3C]
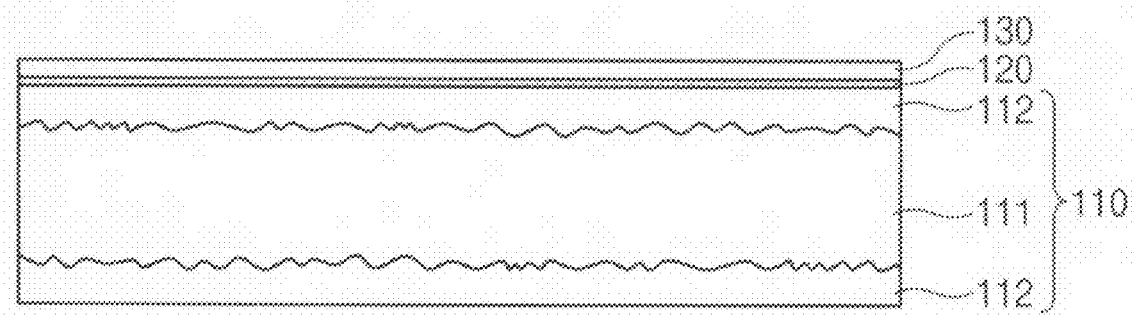
[FIG. 4]
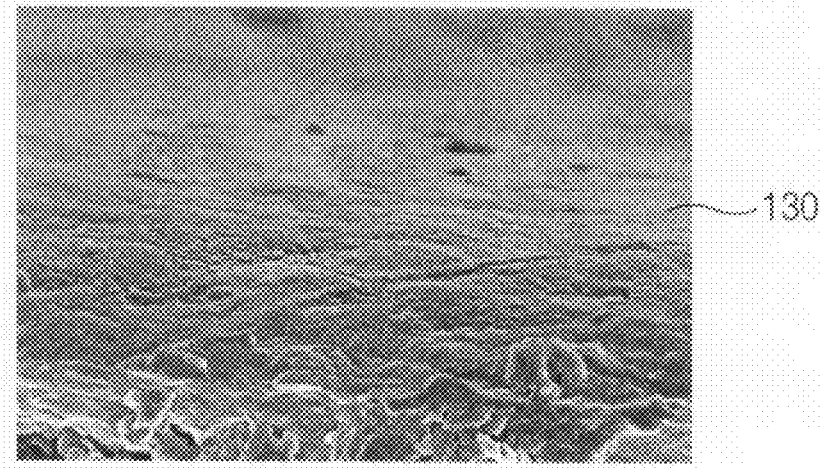

[FIG. 5]
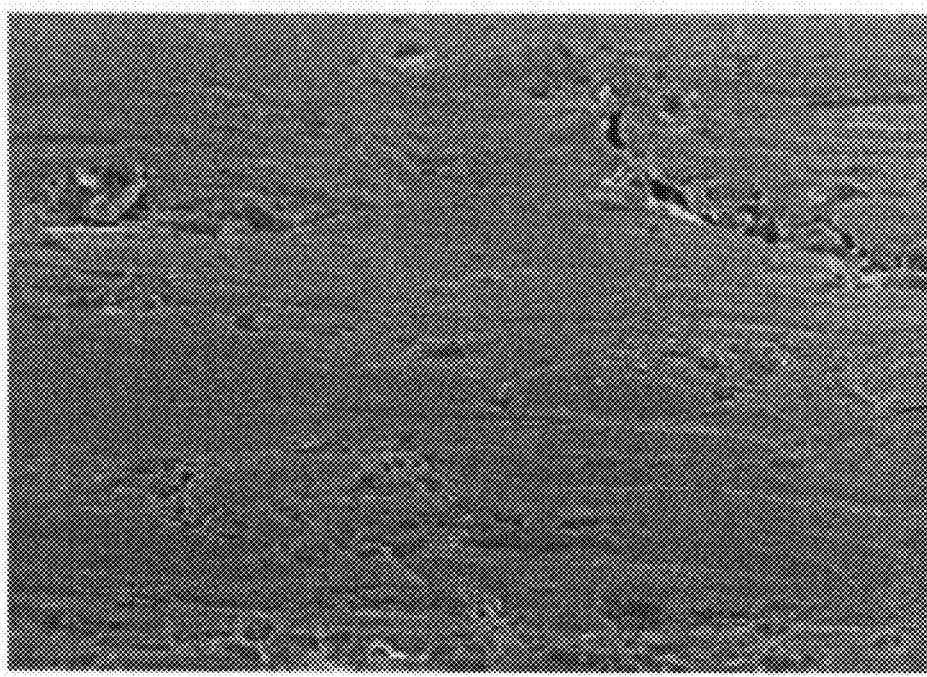

METHOD FOR MANUFACTURING CAPACITOR EMBEDDED IN PCB

CROSS-REFERENCE TO RELATED APPLICATIONS

This application claims the benefit of Korean Patent Application No. 10-2006-0031099 filed with the Korean Intellectual Property Office on Apr. 5, 2006, the disclosure of which is incorporated herein by reference.

BACKGROUND OF THE INVENTION

1. Field of the Invention

The present invention relates to a method for manufacturing a capacitor embedded in a printed circuit board (PCB), and more particularly, to a method for manufacturing a capacitor embedded in a PCB, which can remove a surface defect of a copper clad lamination (CCL) substrate acting as a bottom electrode, thereby improving the yield of the capacitor.

2. Description of the Related Art

Discrete chip resistors or discrete chip capacitors have been mounted on a surface of a PCB. Recently, PCBs with embedded passive elements such as resistors or capacitors have been developed.

In such a PCB technique, passive elements such as resistors or capacitors are embedded in outer or inner layers of the PCB by using new materials and processes, and the embedded passive elements act as an existing chip resistor or chip capacitor.

For example, when a capacitor is buried in an inner or outer layer of the PCB and integrated as a part of the PCB regardless of a PCB size, the capacitor is referred to as an embedded capacitor and the PCB is referred to as an embedded capacitor PCB.

The most important characteristic of the embedded capacitor PCB is that the capacitor need not be mounted on a surface of the PCB because the capacitor is formed as a part of the PCB.

Three methods for the embedded capacitor PCB will be described below.

A first method is to manufacture a polymer thick film type capacitor by depositing, thermally hardening and drying a polymer capacitor paste.

According to the first method, a polymer capacitor phase is deposited on an inner layer of a PCB and is dried. Then, a copper paste is printed and dried to form an electrode. In this way, an embedded capacitor is manufactured.

A second method is to manufacture an embedded discrete type capacitor by coating a ceramic filled photo-dielectric resin on a PCB.

According to the second method, after photo-dielectric resin containing ceramic powder is coated on a substrate, a copper foil is laminated on the photo-dielectric resin to form a top electrode and a bottom electrode. Then, a circuit pattern is formed and the photo-dielectric resin is etched to form an embedded discrete type capacitor.

A third method is to manufacture a capacitor by inserting a separate dielectric layer having a capacitance characteristic into an inner layer of a PCB such that the dielectric layer can replace a decoupling capacitor which has been mounted on a surface of the PCB.

According to the third method, a power distributed decoupling capacitor is manufactured by inserting a dielectric layer with a power electrode and a ground electrode into the inner layer of the PCB.

Meanwhile, compared with an external capacitor, the capacitor embedded in the PCB is difficult to secure a sufficient capacitance because its size is limited according to a volume of the PCB.

Therefore, there is a demand for a technique for embedding a high-density capacitor in the PCB by implementing a high capacitance density per unit area. An example of the high-density capacitor is an external multi layered ceramic capacitor (MLCC) that is not embedded but mounted on the PCB. To this end, a thin film technology has been applied to the method for manufacturing an embedded capacitor in order to increase a permittivity of the dielectric layer but decrease a thickness thereof.

However, when the thin film technology is used to form the dielectric layer thinly about several hundreds of nanometers in order to minimize a size of the capacitor, a formation defect of the dielectric layer may occur according to a surface state of the bottom electrode disposed under the dielectric layer. This leads to an increase of a leakage current and an electrical short between the bottom electrode and the top electrode.

Hereinafter, problems of a conventional capacitor embedded in a PCB will be described below in detail with reference to FIGS. 1 and 2.

FIG. 1 is a cross-sectional view of a conventional capacitor embedded in a PCB. Referring to FIG. 1, the conventional capacitor 100 includes a CCL substrate 110, a dielectric layer 120, and a top electrode 130. The CCL substrate 110 includes a reinforcement member 111 (e.g., FR-4) and copper foils 112 formed on both surfaces of the reinforcement member 111. The CCL substrate 110 acts as a bottom electrode of the embedded capacitor.

A surface of the copper foil 112, that is, a surface of the CCL substrate 110 on which the dielectric layer 120 is formed, has surface defects such as a convex defect and a concave defect, depending on a surface state of the reinforcement member 111.

These surface defects increase a leakage current of the embedded capacitor, degrading the characteristic and reliability of an embedded capacitor PCB.

In addition, when the dielectric layer 120 is formed on the CCL substrate 110 having the surface defects, especially when it is formed thinly about several hundreds of nanometers in order to minimize a size of the capacitor, a defect occurs in the dielectric layer 120, as indicated by a reference symbol "F". The defects will be described in detail with reference to FIG. 2.

FIG. 2 is a photograph illustrating the problem of the conventional capacitor embedded in the PCB. Specifically, FIG. 2 illustrates a convex defect of the CCL substrate in which a convex portion of the CCL substrate 110 passes through the dielectric layer 120 and the top electrode 130 and thus is exposed. In addition, an enlarged convex portion is illustrated in FIG. 2.

When the dielectric layer 120 and the top electrode 130 are sequentially formed on the CCL substrate 110 having the convex defect, the dielectric layer 120 cannot be formed in the convex defect. Therefore, the CCL substrate 110 acting as the bottom electrode is shorted to the top electrode 130.

That is, the surface defect of the CCL substrate increases the leakage current of the embedded capacitor and shorts the bottom electrode to the bottom electrode. Consequently, the characteristic and reliability of the capacitor embedded in the PCB are degraded and its manufacturing yield is reduced.

SUMMARY OF THE INVENTION

An advantage of the present invention is that it provides a method for manufacturing a capacitor embedded in a PCB, which can remove surface defects of a CCL substrate used as a bottom electrode, thereby improving the characteristic, reliability and manufacturing yield of the embedded capacitor.

Additional aspect and advantages of the present general inventive concept will be set forth in part in the description which follows and, in part, will be obvious from the description, or may be learned by practice of the general inventive concept.

According to an aspect of the invention, a method for manufacturing a capacitor embedded in a PCB includes: preparing a CCL substrate having a reinforcement member and copper foils formed on both surfaces of the reinforcement member; planarizing surfaces of the copper foils of the CCL substrate; forming a dielectric layer on the planarized surface of the copper foils; and forming a top electrode on the dielectric layer.

According to another aspect of the present invention, the method further includes cleaning and drying the CCL substrate before and after planarizing the surfaces of the copper foils of the CCL substrate.

According to a further aspect of the present invention, the surfaces of the copper foils of the CCL substrate are planarized by using a mechanical polishing process or an electrolytic polishing process. More preferably, the mechanical polishing process and the electrolytic polishing process are sequentially performed.

According to a further aspect of the present invention, the mechanical polishing process is performed by using a polishing tape in which ceramic particles are coated on a polyester film. The ceramic particles are SiC or $Al_2O_3$ having a size of less than 20 μm.

According to a further aspect of the present invention, the mechanical polishing process includes a first polishing process using a first polishing tape in which ceramic particles are coated on a polyester film, and a second polishing process using a second polishing tape coated with ceramic particles having a size smaller than that of the first polishing tape. The ceramic particles of the first polishing tape are SiC or $Al_2O_3$ having a size of less than 20 μm.

According to a further aspect of the present invention, the electrolytic polishing process is performed by using electrolyte selected from the group consisting of phosphorous acid, sulfuric acid, hydrochloric acid, nitric acid, boric acid, and combinations thereof. The electrolyte further includes an additive containing chromic acid or urea in order to prevent the corrosion of the copper foils. Preferably, 0.5 wt % to 1 wt % additive for an entire electrolyte is added.

According to a further aspect of the present invention, pH of the electrolyte is less than 5. If pH is greater than 6, a polishing rate is lowered so that the surface defects are not removed completely.

According to a further aspect of the present invention, the electrolyte has an electrolytic temperature ranging from 0° C. to 75° C.

According to a further aspect of the present invention, the electrolyte has a current density ranging from 5 $A/dm^2$ to 50 $A/dm^2$.

According to a further aspect of the present invention, the dielectric layer is formed of ceramic composition having a high permittivity.

According to a further aspect of the present invention, the top electrode is formed of at least one selected from the group consisting of Cu, Ni, Al, Pt, Ta, Ag, and alloys thereof.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional capacitor embedded in a PCB;

FIG. 2 is a photograph illustrating the problem of a conventional capacitor embedded in a PCB;

FIGS. 3A to 3C are cross-sectional views illustrating a method for manufacturing a capacitor embedded in a PCB according to an embodiment of the present invention; and FIGS. 4 and 5 are photographs illustrating the effect of the capacitor embedded in the PCB according to the embedded in the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures. In the drawings, the thicknesses of layers and regions are exaggerated for clarity.

Hereinafter, a method of manufacturing a capacitor embedded in a PCB according to an embodiment of the present invention will be described in detail with reference to the drawings:

FIGS. 3A to 3C are cross-sectional views illustrating a method for manufacturing a capacitor embedded in a PCB according to an embodiment of the invention.

Referring to FIG. 3A, a CCL substrate 110 is prepared. The CCL substrate 110 includes a reinforcement member 111 (e.g., FR-4) and copper foils 112 formed on both surfaces of the reinforcement member 111. At this time, the reinforcement member 111 can also be formed of an appropriate material according to purposes of the PCB. In this embodiment, the CCL substrate 110 acts as a bottom electrode of the embedded capacitor.

Meanwhile, a surface of the CCL substrate 110, that is, a surface of the copper foil 112, has surface defects such as a convex defect and a concave defect, depending on a surface state of the reinforcement member 111 which comes in contact with the surface of the copper foil 112.

These surface defects increase a leakage current of the embedded capacitor, degrading the characteristic and reliability of an embedded capacitor PCB. In addition, the surface defects serve as a factor causing defects in a dielectric layer and a top electrode, which will be described below, resulting in reduction of a manufacturing yield.

As described above, because the surface defects of the CCL substrate 110 greatly influence the characteristic and reliability of the embedded capacitor and reduce the manufacturing yield, they must be removed during a process of manufacturing the capacitor embedded in the PCB.

Referring to FIG. 3B, the surfaces of the copper foils 112 in the CCL substrate 110 are planarized. It is preferable that a mechanical polishing or an electrolytic polishing process is used as the planarization process. In order to increase a polishing efficiency, an electrolytic polishing process can be additionally performed after a mechanical polishing process.

That is, the surface defects of the copper foils 112 are removed by planarizing the surface of the CCL substrate 110. Therefore, the problems caused by the surface defects can be solved.

Referring to FIG. 3C, a dielectric layer 120 and a top electrode 130 are sequentially formed on the planarized CCL substrate 110.

The dielectric layer 120 is formed by depositing a ceramic composition having a high permittivity through various thin film forming methods, e.g., ALD, PLD, CVD, etc. Examples of the ceramic composition include BZN, $Al_2O_3$, PZT, PLZT, PT, PMN, PMN-PT, $BaTiO_3$, $HfO_2$, and $SrTiO_3$. The present invention is not limited to them, but can use any materials if they have a high permittivity.

The top electrode 130 can be formed using a low-temperature sputtering process, an evaporation process, or an electroless plating process, and electrode material may be at least one selected from the group consisting of Cu, Ni, Al, Pt, Ta, Ag, and an alloy thereof.

Hereinafter, detailed methods for planarizing the surface of the copper foils in the CCL substrate will be described with reference to FIGS. 4 and 5.

Mechanical Polishing Method

A first cleaning process and a first drying process are sequentially performed on the surface of the CCL substrate having surface defects. It is preferable to use DI water as a cleaning solution.

Thereafter, the CCL substrate is polished until its surface defects are removed by using a polishing tape in which ceramic particles are coated on a polyester film. The ceramic particles preferably have a size of less than 20 μm, more preferably a size of less than 5 μm. This aims to minimize the occurrence of scratches on the surface of the CCL substrate due to the large-sized ceramic particles because the surface of the CCL substrate is roughly polished as the size of the ceramic particles increases. Examples of such fine ceramic particles are SiC and $Al_2O_3$.

Then, a second cleaning process and a second drying process are sequentially performed on the planarized surface of the CCL substrate.

FIG. 4 is a photograph illustrating the effects of the embedded capacitor manufactured using the CCL substrate planarized by the mechanical polishing process. As can be seen in FIG. 4, when the surface defects of the CCL substrate acting as the bottom electrode are removed by using the mechanical polishing process and then the dielectric layer and the top electrode are sequentially formed on the CCL substrate, the surface defects (100 in FIG. 2) of the CCL substrate do not protrude over the top electrode 130.

According to the present invention, a first polishing process is performed by using a first polishing tape in which first ceramic particles having a size of less than 20 μm are coated on a polyester film, and a second polishing process is performed by using a second polishing tape coated with ceramic particles having a size smaller than that of the first polishing tape. Therefore, scratches of the CCL substrate due to the first polishing tape having the large ceramic particles are mitigated by the second polishing tape having the smaller ceramic particles, thereby minimizing the occurrence of the scratches on the surface of the CCL substrate.

Electrolytic Polishing Method

Like the mechanical polishing method, a first cleaning process and a first drying process are sequentially performed on a surface of a CCL substrate having surface defects.

Then, an electrolytic polishing process is performed for a predetermined time by soaking the CCL substrate in electrolyte composed of a combination of one or more acids selected from the group consisting of phosphorous acid, sulfuric acid, hydrochloric acid, nitric acid, boric acid and the like. The electrolytic polishing time can be varied depending on the characteristic of the copper foils and the processing conditions.

When the electrolyte has pH of greater than 6.0, a polishing rate is so low that the surface defects are not removed completely. Thus, it is preferable that the electrolyte has pH of less than 5.0.

Specifically, it is preferable that the electrolyte further includes an additive containing chromic acid or urea in order to prevent the corrosion of the copper foils of the CCL substrate. When less than 0.5 wt % additive for the entire electrolyte is added, the additive cannot nearly perform the function of preventing the corrosion of the copper foils. When greater than 1 wt % additive is added, it has the same effect as an electrolyte containing 1 wt % additive. Therefore, it is preferable that the additive contained in the electrolyte is in a range from 0.5 wt % to 1 wt %.

In addition, it is preferable that a temperature of the electrolyte is in a range from 0° C. to 75° C. When the temperature is below 0° C., the electrolyte is frozen so that the electrolytic polishing is not performed. When the temperature exceeds 75° C., an electrolytic polishing speed increases so that the copper foils are not uniformly polished.

When a current density of the electrolyte is less than 5 $A/dm^2$, a polishing characteristic of the electrolytic polishing is not almost exhibited. When the current density exceeds 50 $A/dm^2$, the electrolytic polishing speed increase so that the copper foils are not uniformly polished. Thus, it is preferable that the current density of the electrolyte is in a range from 5 $A/dm^2$ to 50 $A/dm^2$.

Next, a second cleaning process and a second drying process are sequentially performed on the planarized CCL substrate.

FIG. 5 is a photograph illustrating the effect of the embedded capacitor manufactured using the CCL substrate planarized by the electrolytic polishing process. As can be seen in FIG. 5, when the surface defects of the CCL substrate acting as the bottom electrode are removed by using the electrolytic polishing process and then the dielectric layer and the top electrode are sequentially formed on the CCL substrate, the surface defects (100 in FIG. 2) of the CCL substrate do not protrude over the top electrode 130.

As described above, the present invention can prevent the leakage current generated by the surface defects of the CCL substrate by sequentially forming the dielectric layer and the top electrode after removing the surface defects of the CCL substrate acting as the bottom electrode. In addition, the present invention can prevent the electrical short between the bottom electrode and the bottom electrode, which is caused by the formation defect of the dielectric layer.

Accordingly, the present invention can improve the characteristic and reliability of the embedded capacitor and can also increase the manufacturing yield.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method for manufacturing a capacitor embedded in a printed circuit board (PCB), comprising:

preparing a copper clad lamination (CCL) substrate having a reinforcement member and copper foils formed on both surfaces of the reinforcement member;
planarizing surfaces of the copper foils of the CCL substrate;
forming a dielectric layer on the planarized surface of the copper foils; and
forming a top electrode on the dielectric layer,
wherein the surfaces of the copper foils of the CCL substrate are planarized by using a mechanical polishing process,
wherein the mechanical polishing process is performed by using a polishing tape in which ceramic particles are coated on a polyester film.

2. The method according to claim 1, further comprising:
cleaning and drying the CCL substrate before and after planarizing the surfaces of the copper foils of the CCL substrate.

3. The method according to claim 1,
wherein the surfaces of the copper foils of the CCL substrate are planarized by sequentially performing a mechanical polishing process and an electrolytic polishing process.

4. The method according to claim 1,
wherein the ceramic particles have a size of less than 20 μm.

5. The method according to claim 1,
wherein the ceramic particles are SiC or $Al_2O_3$.

6. The method according to claim 1 or 3,
wherein the electrolytic polishing process is performed by using electrolyte composed of a combination of one or more acids selected from the group consisting of phosphorous acid, sulfuric acid, hydrochloric acid, nitric acid, boric acid and the like.

7. The method according to claim 6,
wherein the electrolyte has pH of less than 5.

8. The method according to claim 6,
wherein the electrolyte further comprises an additive containing chromic acid or urea.

9. The method according to claim 8,
wherein 0.5 wt % to 1 wt % additive for an entire electrolyte is added.

10. The method according to claim 6,
wherein the electrolyte has an electrolytic temperature ranging from 0° C. to 75° C.

11. The method according to claim 6,
wherein the electrolyte has a current density ranging from 5 A/dm$^2$ to 50 A/dm$^2$.

12. The method according to claim 1,
wherein the dielectric layer is formed of ceramic composition.

13. The method according to claim 12,
wherein the ceramic composition is selected from the group consisting of BZN, $Al_2O_3$, PZT, PLZT, PT, PMN, PMN-PT, $BaTiO_3$, $HfO_2$, and $SrTiO_3$.

14. The method according to claim 1,
wherein the top electrode is formed of at least one selected from the group consisting of Cu, Ni, Al, Pt, Ta, Ag, and alloys thereof.

15. A method for manufacturing a capacitor embedded in a printed circuit board (PCB), comprising:
preparing a copper clad lamination (CCL) substrate having a reinforcement member and copper foils formed on both surfaces of the reinforcement member;
planarizing surfaces of the copper foils of the CCL substrate;
forming a dielectric layer on the planarized surface of the copper foils; and
forming a top electrode on the dielectric layer,
wherein the surfaces of the copper foils of the CCL substrate are planarized by using a mechanical polishing process,
wherein the mechanical polishing process comprises a first polishing process using a first polishing tape in which ceramic particles are coated on a polyester film, and a second polishing process using a second polishing tape coated with ceramic particles having a size smaller than that of the first polishing tape.

16. The method according to claim 15,
wherein the ceramic particles of the first polishing tape have a size of less than 20 μm.

17. The method according to claim 15,
wherein the ceramic particles are SiC or $Al_2O_3$.

* * * * *